(12) United States Patent
Abarra et al.

(10) Patent No.: US 8,053,747 B2
(45) Date of Patent: Nov. 8, 2011

(54) SUBSTRATE PROCESSING APPARATUS AND CLEANING METHOD OF THE SAME

(75) Inventors: Einstein Noel Abarra, Hachioji (JP); Masahiro Shibamoto, Yokohama (JP)

(73) Assignee: Canon Anelva Corporation, Kanagawa-Ken (JP)

(*) Notice: Subject to any disclaimer, the term of this patent is extended or adjusted under 35 U.S.C. 154(b) by 247 days.

(21) Appl. No.: 12/579,636

(22) Filed: Oct. 15, 2009

(65) Prior Publication Data
US 2010/0096568 A1    Apr. 22, 2010

(30) Foreign Application Priority Data

Oct. 16, 2008  (JP) ................................. 2008-266939
Oct. 2, 2009   (JP) ................................. 2009-230993

(51) Int. Cl.
    *H01L 21/00*    (2006.01)
(52) U.S. Cl. ............. 250/492.21; 250/492.1; 250/492.3; 250/493.1; 315/111.81; 315/111.91
(58) Field of Classification Search ............... 250/492.1, 250/492.21, 492.3, 493.1; 315/111.81, 111.91
    See application file for complete search history.

(56) References Cited

U.S. PATENT DOCUMENTS

| | | | | |
|---|---|---|---|---|
| 4,541,890 A * | 9/1985 | Cuomo et al. | ............ | 156/345.39 |
| 4,851,668 A * | 7/1989 | Ohno et al. | .................... | 250/251 |
| 4,942,304 A * | 7/1990 | Boston | ...................... | 250/492.3 |
| 5,633,506 A * | 5/1997 | Blake | ...................... | 250/492.21 |
| 6,153,067 A * | 11/2000 | Maishev et al. | .......... | 204/298.04 |
| 6,236,163 B1 * | 5/2001 | Maishev et al. | .......... | 315/111.81 |
| 6,496,891 B1 | 12/2002 | Cluff et al. | | |
| 6,515,426 B1 * | 2/2003 | Tanaka et al. | ............. | 315/111.81 |
| 6,559,462 B1 * | 5/2003 | Carpenter et al. | ........ | 250/492.21 |
| 6,756,600 B2 * | 6/2004 | Ng et al. | .................. | 250/492.21 |
| 6,815,690 B2 * | 11/2004 | Veerasamy et al. | ....... | 250/423 R |
| 6,992,311 B1 * | 1/2006 | Ring et al. | ............... | 250/492.21 |
| 7,446,326 B2 * | 11/2008 | Chaney et al. | ........... | 250/492.21 |
| 7,541,597 B2 * | 6/2009 | Holle et al. | ............... | 250/423 R |
| 7,569,837 B2 * | 8/2009 | Shigehiro et al. | ......... | 250/423 R |
| 7,629,590 B2 * | 12/2009 | Horsky et al. | ............. | 250/423 R |
| 7,791,047 B2 * | 9/2010 | Horsky et al. | ............. | 250/492.21 |

(Continued)

FOREIGN PATENT DOCUMENTS

JP          2005-56535 A         3/2005

OTHER PUBLICATIONS

Tetsuya Endo et al., U.S. Appl. No. 12/477,510, filed Jun. 3, 2009.

(Continued)

*Primary Examiner* — David A Vanore
(74) *Attorney, Agent, or Firm* — Buchanan Ingersoll & Rooney P.C.

(57) ABSTRACT

A method for cleaning a substrate processing apparatus in which a first ion beam generator and a second ion beam generator are arranged opposite to each other to sandwich a plane on which a substrate is to be placed, and which processes two surfaces of the substrate, comprises steps of retreating the substrate from a position between the first ion beam generator and the second ion beam generator, and cleaning the second ion beam generator by emitting an ion beam from the first ion beam generator to the second ion beam generator.

10 Claims, 4 Drawing Sheets

U.S. PATENT DOCUMENTS

| | | | |
|---|---|---|---|
| 7,888,662 B2 * | 2/2011 | Biloiu et al. | 250/492.21 |
| 7,989,762 B2 * | 8/2011 | Holle et al. | 250/288 |
| 7,994,487 B2 * | 8/2011 | Ray | 250/492.2 |
| 2002/0000523 A1 * | 1/2002 | Ng et al. | 250/492.21 |
| 2002/0130278 A1 * | 9/2002 | Vella | 250/492.21 |
| 2005/0211923 A1 * | 9/2005 | Banks | 250/492.21 |
| 2006/0054840 A1 * | 3/2006 | Madokoro et al. | 250/492.21 |
| 2006/0115584 A1 | 6/2006 | Hattori et al. | |
| 2007/0045570 A1 * | 3/2007 | Chaney et al. | 250/492.21 |
| 2009/0200457 A1 * | 8/2009 | Holle et al. | 250/281 |
| 2009/0236219 A1 | 9/2009 | Endo et al. | |
| 2010/0176296 A1 * | 7/2010 | Kaito et al. | 250/307 |

OTHER PUBLICATIONS

Einstein Noel Abarra, U.S. Appl. No. 12/547,259, filed Aug. 25, 2009.

Einstein Noel Abarra, U.S. Appl. No. 12/573,443, filed Oct. 5, 2009.

Abarra, U.S. Appl. No. 12/547,259, entitled "Thin Film Formation Apparatus and Magnetic Recording Medium Manufacturing Method" filed Aug. 25, 2009.

Abarra, U.S. Appl. No. 12/573,443, entitle "Sputtering Apparatus, Thin Film Formation Apparatus, and Magnetic Recording Medium Manufacturing Method" filed Oct. 5, 2009.

* cited by examiner

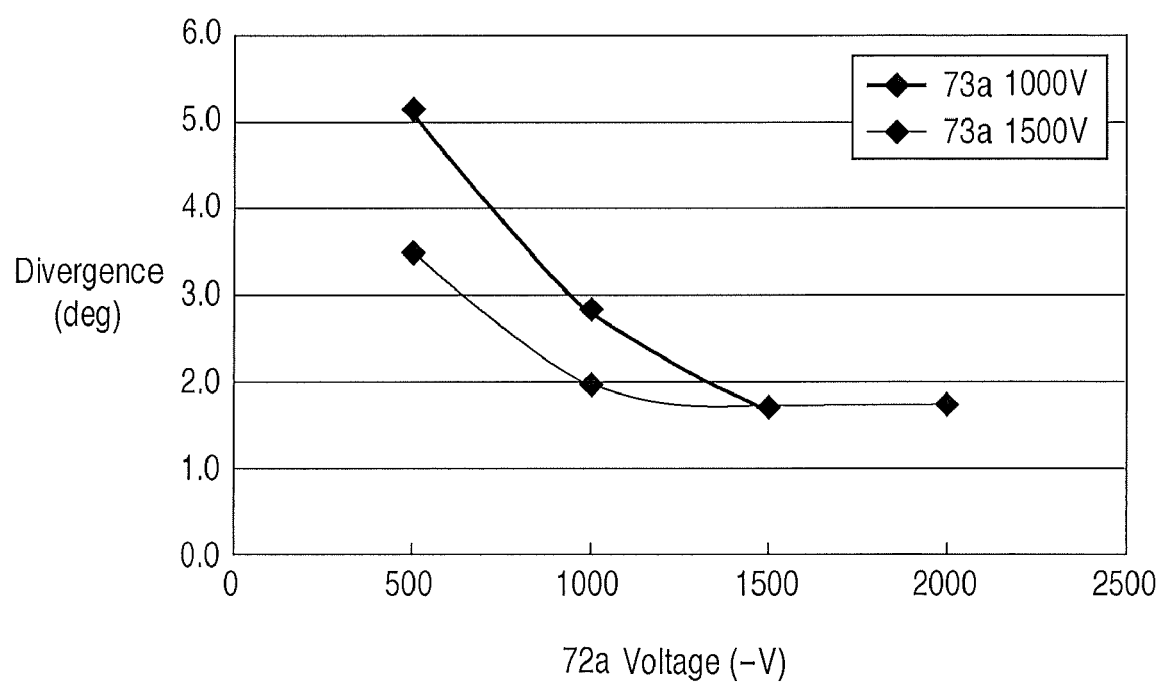
F I G. 4

SUBSTRATE PROCESSING APPARATUS AND CLEANING METHOD OF THE SAME

BACKGROUND OF THE INVENTION

1. Field of the Invention

The present invention relates to a substrate processing apparatus and a cleaning method of the same.

2. Description of the Related Art

The manufacturing process of a magnetic recording disk such as a hard disk roughly includes a pre-step of forming an underlayer, a magnetic film as a recording layer, and a protective film for protecting the recording layer, and a post-step of forming a lubricating layer on the surface of a substrate on which the protective film is formed. Since the magnetic recording disk generally includes recording layers on the two surfaces of a substrate, various processes are performed on the two surfaces of the substrate in the above-mentioned individual steps. For example, as a technique of processing the two surfaces of a substrate as described above, a technique by which ion guns are installed on the two sides of a substrate, and ionized argon gas ion beams are emitted from the ion guns to the two surfaces of the substrate (Japanese Patent Laid-Open No. 2005-56535). In the substrate processing technique in which the ion guns (ion beam generators) are arranged to face the two surfaces of a substrate as described in Japanese Patent Laid-Open No. 2005-56535, one ion beam generator receives the ion beam from the other ion beam generator. This poses the problem that contaminants stick to the ion beam emission surface or to the interior of a plasma generation chamber.

SUMMARY OF THE INVENTION

The present invention has been made in consideration of the above situation, and has as its object to provide a method of cleaning a substrate processing apparatus including ion beam generators arranged opposite to each other, and a substrate processing apparatus having this function.

A first aspect of the present invention provides a method for cleaning a substrate processing apparatus in which a first ion beam generator and a second ion beam generator are arranged opposite to each other to sandwich a plane on which a substrate is to be placed, and which processes two surfaces of the substrate, the cleaning method comprising steps of retreating the substrate from a position between the first ion beam generator and the second ion beam generator, and cleaning the second ion beam generator by emitting an ion beam from the first ion beam generator to the second ion beam generator.

A second aspect of the present invention provides an substrate processing apparatus for processing a substrate, comprising a first ion beam generator and a second ion beam generator arranged opposite to each other to sandwich a plane on which the substrate is to be placed, and a controller which, with no substrate being placed on the plane, controls the first ion beam generator to clean the second ion beam generator by emitting an ion beam from the first ion beam generator to the second ion beam generator.

Further features of the present invention will become apparent from the following description of exemplary embodiments with reference to the attached drawings.

BRIEF DESCRIPTION OF THE DRAWINGS

FIG. 4 is a view for explaining the relationship between the change in negative potential of a central electrode and the divergent angle of an ion beam.

DESCRIPTION OF THE EMBODIMENTS

Embodiments of the present invention will be explained below with reference to the accompanying drawings, but the present invention is not limited to these embodiments.

(Substrate Processing Apparatus)

Figure 1:
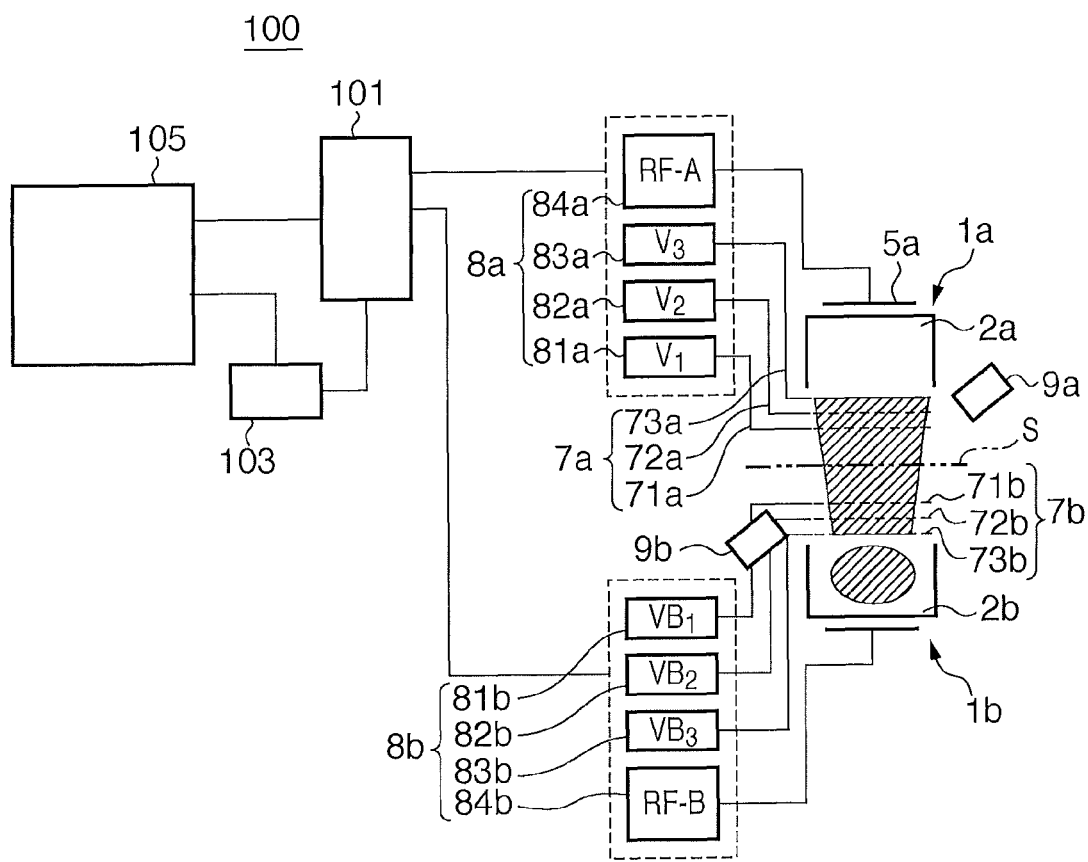
FIG. 1 is a block diagram showing the arrangement of a substrate processing apparatus when it is viewed from above.

First, a substrate processing apparatus according to the present invention will be explained below with reference to FIG. 1. The substrate processing apparatus has a function of performing a cleaning method according to the present invention. This cleaning method cleans at least one, and preferably both, of two ion beam generators of the substrate processing apparatus. FIG. 1 is a block diagram showing the arrangement of the substrate processing apparatus when it is viewed from above.

As shown in FIG. 1, a substrate processing apparatus 100 includes first and second ion beam generators 1a and 1b arranged opposite to each other so as to sandwich a plane S on which a substrate (wafer) is to be placed, a controller 101, a counter 103, and a computer interface 105.

The substrate to be placed on the plane S is, e.g., a substrate for manufacturing a magnetic recording medium such as a hard disk, and generally has an opening in the center of a member having an almost circular disk shape. A substrate carrier can hold the substrate upright along the vertical direction and place it on the plane S.

The first ion beam generator 1a and second ion beam generator 1b are arranged opposite to each other so as to face the two surfaces of the substrate placed on the plane S. In the arrangement shown in FIG. 1, the first and second ion beam generators 1a and 1b are arranged such that the ion beam emission surfaces of the first and second ion beam generators 1a and 1b are almost parallel to the surfaces to be processed of the substrate.

The first ion beam generator 1a includes an electrode 5a, a discharge bath 2a for generating a plasma, and an extracting electrode 7a (including electrodes 71a, 72a, and 73a in this order from the plane S on which the substrate is placed) as a mechanism of extracting ions from the plasma. The electrodes 71a, 72a, and 73a are respectively connected to voltage sources 81a, 82a, and 83a so as to be independently controllable. A neutralizer 9a is installed near the extracting electrode 7a. The neutralizer 9a is configured to be able to emit electrons to the second ion beam generator 1b in order to neutralize an ion beam (an ion beam having positive electric charge) emitted from the ion beam generator 1a.

Argon (Ar) supplied from a gas supply unit (not shown) into the discharge bath 2a is excited by the application of RF power from an RF source 84a to the electrode 5a, thereby generating a plasma. Ions in this plasma are extracted by the extracting electrode 7a, and collide against the substrate placed on the plane S. The substrate is etched in this way.

The second ion beam generator 1b is constructed similarly to the first ion beam generator 1a.

The controller 101 is connected to a voltage source 8a of the first ion beam generator 1a and a voltage source 8b of the second ion beam generator 1b, and controls the voltage sources 8a and 8b. The counter 103 is connected to the controller 101, and counts substrates processed by the ion beam generators 1a and 1b. The counter 103 is configured to be able to instruct the controller 101 to start a cleaning process when the count reaches a predetermined number (e.g., 1,000).

The computer interface 105 is connected to the controller 101 and counter 103, and configured to enable the user of the substrate processing apparatus to input the cleaning conditions (e.g., the processing time).

An ion beam generator 1 (1a or 1b) will be explained in detail below with reference to FIGS. 2, 3A, and 3B.

Figure 2:
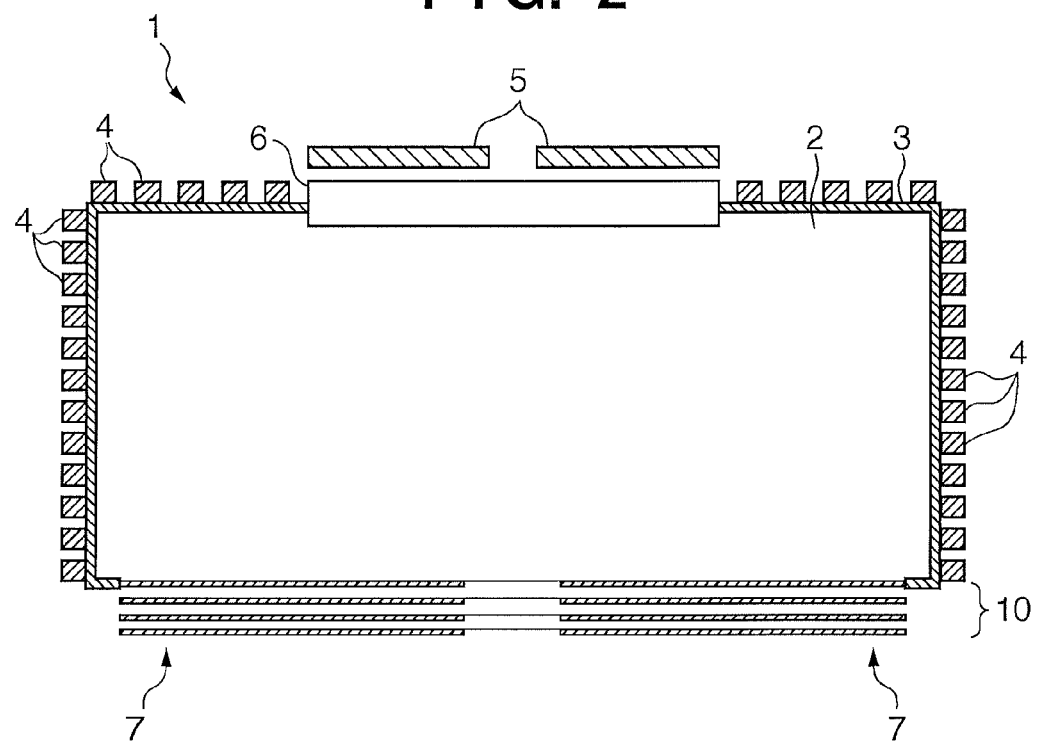
FIG. 2 is a schematic sectional view showing the structure of an ion beam generator.
Figure 3:
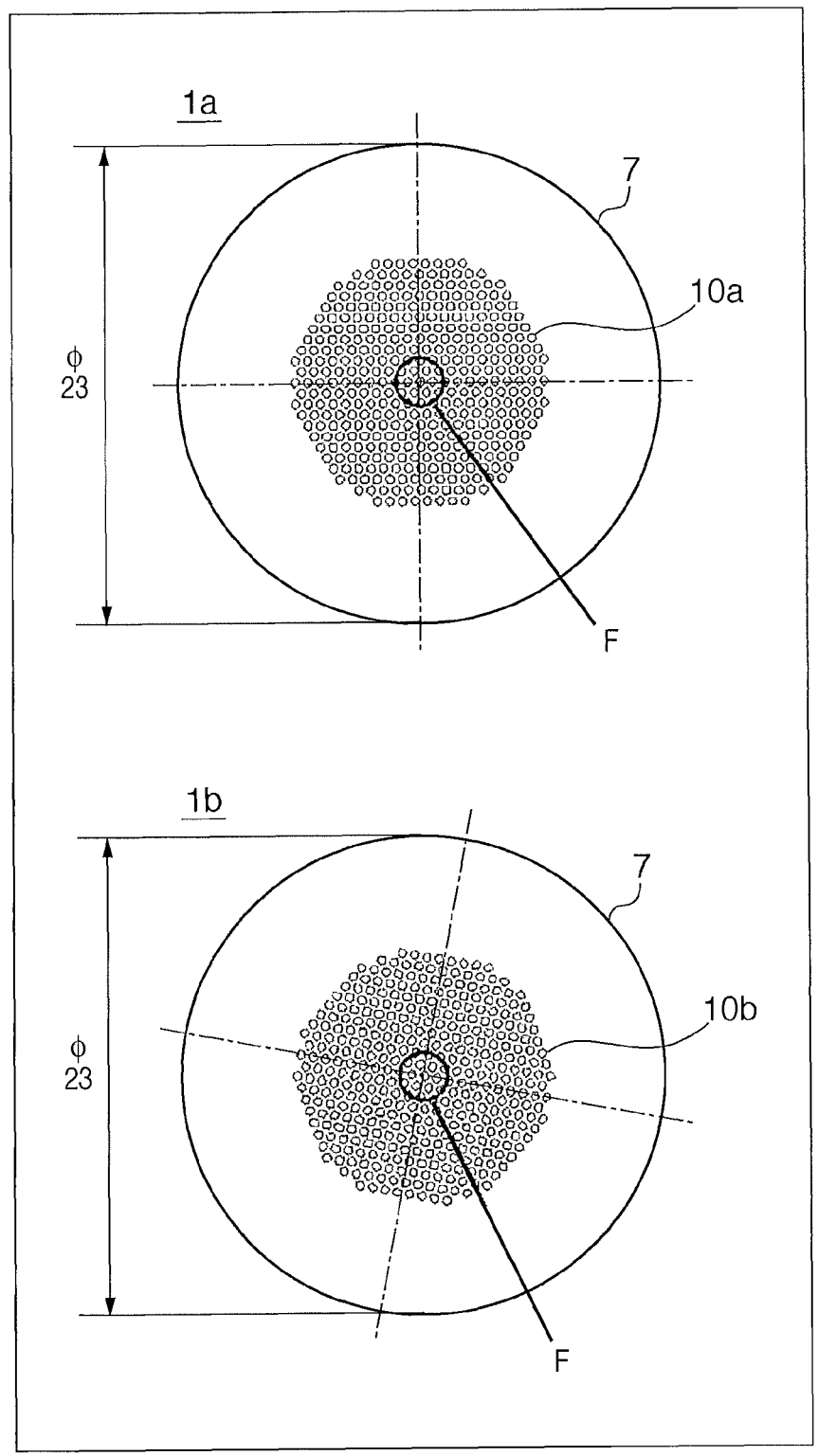
FIG. 3 is a schematic view showing grids of the ion beam generator.

FIG. 2 is a schematic sectional view showing the structure of the ion beam generator. FIG. 3 is a schematic view showing grids of the ion beam generator. Note that the first and second ion beam generators 1a and 1b have the same structure, so the structure will be explained by appropriately omitting suffixes a and b.

As shown in FIG. 2, the ion beam generator 1 includes a discharge bath 2 for confining a plasma. The pressure of the discharge bath 2 is normally maintained within the range of about $10^{-4}$ Pa ($10^{-5}$ mb) to about $10^{-2}$ Pa ($10^{-3}$ mb). The discharge bath 2 is isolated from an external space by a plasma confining vessel 3. A multipole magnetic unit 4 for trapping ions released in the discharge bath 2 by the formation of a plasma is installed around the plasma confining vessel 3. The magnetic unit 4 normally includes a plurality of bar-like permanent magnets. In one configuration, N and S cycles are generated along only one axis by using a plurality of relatively long bar magnets having alternately changing polarities. Another configuration uses a "checkerboard" arrangement. In this configuration, shorter magnets are used, and N and S cycles spread on a plane formed by two axes perpendicular to each other.

An RF coil 5 supplies RF power to the discharge bath 2 via an inductive RF power coupling window 6 attached to the rear wall (the wall opposite to the plane S on which the substrate is placed) of the plasma confining vessel 3.

The front wall (the wall facing the plane S on which the substrate is placed) of the plasma confining vessel 3 has an ion beam emission surface (see FIG. 3). The emission surface has an extracting mechanism (extracting electrode) 7 for extracting ions from the plasma formed in the discharge bath 2, and accelerating the extracted ions. As shown in FIG. 3, the extracting electrode 7 can have grid structures. Each grid structure has a plurality of fine holes close to each other.

As a structure for inhibiting the entrance of an ion beam, the substrate processing apparatus of this embodiment has a structure in which those portions of a first grid 10a and second grid 10b which face the opening in the substrate are closed so as not to allow the passage of an ion beam.

More specifically, a closed region F that is closed so as not to allow ion beam emission is formed in the center of each of the first grid 10a and second grid 10b. This makes it possible to prevent substances removed by ion beams generated from the ion beam generators 1a and 1b arranged opposite to each other from passing through the central opening in the substrate and causing the generators 1a and 1b to contaminate each other. Note that the size of the closed region F can properly be set in accordance with the substrate size and the central opening in the substrate.

Furthermore, in the substrate processing apparatus of this embodiment, the grid 10a of the first ion beam generator 1a and the grid 10b of the second ion beam generator 1b can asymmetrically be formed as the structure for inhibiting the entrance of an ion beam. For example, the grid 10a of the first ion beam generator 1a shown in FIG. 3 and the grid 10b of the second ion beam generator 1b shown in FIG. 3 have a relationship in which one is relatively rotated with respect to the other through a predetermined angle (e.g., 10°) around the central axis, thereby forming an asymmetrical grid structure. This is so because if the grid structure is symmetrical, an ion beam emitted from a specific fine hole may pass through a fine hole in a symmetrical position because the ion beam has high directivity, thereby sticking contaminants or inflicting damage to the interior of the opposite discharge bath 2. Accordingly, when the grid 10a of the first ion beam generator 1a and the grid 10b of the second ion beam generator 1b are asymmetrically shifted, no highly directive ion beams enter the opposite ion beam generators 1a and 1b through the opening in the substrate. This makes it possible to suppress mutual contamination and damage of the ion beam generators 1a and 1b.

In the grid structure, the grids 10a and 10b need not entirely be symmetrical. However, at least the central regions of the first grid 10a and second grid 10b are preferably formed to be asymmetrical.

Also, to enable fine adjustment of the asymmetry of the first grid 10a and second grid 10b, at least one of the grids 10a and 10b may also have a grid rotating mechanism for rotating the grid. This is so because only one of the first grid 10a and second grid 10b need be rotated to secure the asymmetry of the grids 10a and 10b.

Referring back to FIG. 1, an extracting electrode 7 includes three electrodes 73, 72, and 71 in this order from the side of the discharge bath 2, and these three electrodes are configured to enable independent voltage control. In this embodiment, the electrodes 73, 72, and 71 are respectively controlled at a positive potential, a negative potential, and the ground potential.

(Cleaning Method of Substrate Processing Apparatus)

Next, a cleaning method of the substrate processing apparatus or ion beam generator of this embodiment will be explained below with reference to FIG. 1.

When performing substrate processing such as etching by using the first ion beam generator 1a and second ion beam generator 1b arranged opposite to each other, a substrate held by the substrate carrier is placed on the plane S between the ion beam generators 1a and 1b.

In the cleaning method of a preferred embodiment of the present invention, no substrate is placed between the first ion beam generator 1a and second ion beam generator 1b, and one of the ion beam generators 1a and 1b directly emits an ion beam to the other. In addition, the other of the ion beam generators 1a and 1b preferably directly emits an ion beam to the one of the ion beam generators 1a and 1b.

More specifically, when performing cleaning by the cleaning method of the preferred embodiment of the present invention, a retreating step of retreating a substrate W from a position between the first ion beam generator 1a (or 1b) and second ion beam generator 1b (or 1a) is performed. Then, a removing step of removing the electric charge (positive electric charge) held on the second ion beam generator 1b (or 1a) is performed. Furthermore, a cleaning step of cleaning the second ion beam generator 1b (or 1a) by emitting an ion beam from the first ion beam generator 1a (or 1b) to the second ion beam generator 1b (or 1a) is performed. Consequently, contaminants sticking to the second ion beam generator 1b (or 1a) can be removed. The removing step and cleaning step can be executed alternately, in parallel, or simultaneously.

Subsequently, it is possible to further perform a step of cleaning the first ion beam generator 1a (or 1b) by emitting an ion beam from the second ion beam generator 1b (or 1a) to the first ion beam generator 1a (or 1b).

As practical examples of the present invention, cleaning methods of the first to third embodiments will be explained below. Note that when performing cleaning by the cleaning methods of the first to third embodiments, a carrier transfer mechanism (not shown) initially retreats a substrate from a position between the ion beam generators 1a and 1b.

Cleaning Method of First Embodiment

The cleaning method of the first embodiment is an example of cleaning the ion beam generator 1b (or 1a) by emitting an ion beam from the ion beam generator 1a (or 1b).

After a gas supply unit (not shown) supplies a processing gas such as Ar into the discharge bath 2a of the ion beam generator 1a, the RF source 84a applies a radio frequency to the electrode 5a, thereby generating a plasma in the discharge bath 2a. In this step, the controller 101 sets the voltage source 8a such that the electrode 71a is at the ground potential, the electrode 72a is at a negative potential (e.g., −500 to −1,500 V), and the electrode 73a is at a positive potential (e.g., 500 to 1,000 V). By thus controlling the electrode voltages, the plasma emits an ion beam (positive argon ions).

Then, to remove the positive electric charge held on the ion beam generator 1b, the neutralizer 9a emits electrons to the ion beam generator 1b. This neutralizes the positive electric charge generated by the emission of the positive argon ion beam. That is, when the ion beam generator 1a emits a positive argon ion beam to the ion beam generator 1b, the ion beam generator 1b is positively charged to repel the positive argon ion beam, and this makes cleaning unable to perform. Therefore, the positive argon ion beam is neutralized by emitting electrons from the neutralizer 9a.

While the ion beam generator 1b is thus prevented from holding positive electric charge, contaminants sticking to the electrode 7b of the ion beam generator 1b are removed by emitting an ion beam from the ion beam generator 1a.

Similarly, contaminants sticking to the electrode 7a of the opposite ion beam generator 1a are removed by emitting an ion beam from the ion beam generator 1b.

It is also possible to adjust the ion beam divergent angles by appropriately adjusting the three electrodes 71a, 72a, and 73a described above.

FIG. 4 is a view for explaining the relationship between the change in negative potential of the central electrode and the divergent angle of the ion beam. That is, the graph shown in FIG. 4 indicates the ion beam divergent angle when the electrode 71a is fixed at the ground potential, the electrode 73a is fixed at 1,000 or 1,500 V, and the negative potential of the electrode 72a is changed. FIG. 4 reveals that the ion beam divergent angle can be decreased by thus applying a negative potential to the central electrode 72a.

In the cleaning method of the first embodiment, no substrate exists during cleaning between the ion beam generators 1a and 1b arranged opposite to each other. Accordingly, an ion beam emitted from the ion beam generator 1a (or 1b) can directly be applied to the ion beam generator 1b (or 1a). During this cleaning, the neutralizer 9a neutralizes the positive argon ion beam by emitting electrons. This makes it possible to remove contaminants sticking to the electrode 7b (or 7a) of the ion beam generator 1b (or 1a) while the electrode 7b (or 7b) of the ion beam generator 1b (or 1a) is prevented from holding positive electric charge.

Cleaning Method of Second Embodiment

The cleaning method of the second embodiment is an example that enables cleaning by emitting an ion beam from the ion beam generator 1a (or 1b), and controlling the extracting electrode of the ion beam generator 1b (or 1a).

Similar to the first embodiment, the controller 101 sets the voltage source 8a such that the electrodes 71a, 72a, and 73a of the ion beam generator 1a are respectively at the ground potential, a negative potential (e.g., −250 to −2,000 V), and a positive potential (e.g., 250 to 2,000 V). By thus controlling the electrode voltages, a plasma emits an ion beam (positive argon ions). In the second embodiment, the neutralizer 9a does not neutralize the ion beam (positive argon ions), so the positive argon ion beam reaches the opposite ion beam generator 1b.

That is, in the second embodiment, a negative potential is applied to an electrode as an object of cleaning among the electrodes 71b, 72b, and 73b forming the extracting electrode 7b of the ion beam generator 1b, thereby drawing the positive argon ion beam into the ion beam generator 1b. In this time, the electrodes which are not an object of cleaning may be grounded. The electrodes 71b, 72b, and 73b are preferably cleaned from the electrode arranged at a side of the plane S (i.e., in the order of the electrodes 71b, 72b, and 73b) so as to prevent re-sticking of contaminants. That is, firstly, a negative potential is applied to the electrode 71b which is arranged at the side of the plane S and is selected as a first object of cleaning, or the electrode 71b is grounded, and the other electrodes 72b and 73b are grounded. Next, a negative potential is applied to the electrode 72b which is arranged at the central position and is selected as a second object of cleaning, or the electrode 72b is grounded, and the other electrodes 71b and 73b are grounded. Finally, a negative potential is applied to the electrode 73b which is arranged at a side of the discharge bath 2a and is selected as a final object of cleaning, or the electrode 73b is grounded, and the other electrodes 71b and 72b are grounded. Alternatively, the electrodes 71b, 72b and 73b can be simultaneously cleaned. In this case, a relatively lower potential can be applied to the electrode arranged at the side of the discharge bath 2a and a relatively higher potential can be applied to the electrode arranged at the side of the plane S. For example, the electrode 71b can be grounded, −100 V can be applied to the electrode 72b and −200 V can be applied to the electrode 73b.

As described above, while a negative potential is applied to the electrode 72b as an object of cleaning of the extracting electrode 7b of the ion beam generator 1b, the ion beam generator 1a emits an ion beam to the ion beam generator 1b. This makes it possible to remove contaminants sticking to the electrode 7b of the ion beam generator 1b. This method can also prevent the electrode 72b as an object of cleaning from holding positive electric charge.

Likewise, the ion beam generator 1b emits an ion beam to remove contaminants sticking to the electrode 7a of the opposite ion beam generator 1a.

In the cleaning method of the second embodiment, no substrate W exists during cleaning between the two ion beam generators 1a and 1b arranged opposite to each other. Accordingly, an ion beam emitted from the ion beam generator 1a (or 1b) can directly be applied to the ion beam generator 1b (or 1a). During this cleaning, the neutralizer 9a does not neutralize the positive argon ions, and a negative potential is applied to an electrode as an object of cleaning of the extracting electrode 7b (or 7a) of the ion beam generator 1b (or 1a). This makes it possible to draw the positive argon ion beam into the ion beam generator 1b (or 1a). Thus, while the electrode 7b (or 7a) of the ion beam generator 1b (or 1a) is prevented from holding positive electric charge, contaminants sticking to the electrode 7b (or 7a) of the ion beam generator 1b (or 1a) can be removed.

Cleaning Method of Third Embodiment

When performing cleaning by adjusting the electrodes in the same manner as in the first and second embodiments, a gas supply unit (not shown) may also supply an etching gas into a vacuum vessel. This vacuum vessel is configured to surround at least the space between the ion beam generators 1a and 1b, and isolates the interior of the vacuum vessel from the external environment.

Reactive ion etching for processing a multilayered magnetic film desirably etches the multilayered magnetic film by using an alcohol having at least one hydroxyl group as an etching gas.

As the etching gas, it is also possible to use methanol and ketones (e.g., methyl ethyl ketone, isopropyl methyl ketone, and methyl propyl ketone) represented by a formula RCOR' (R or R' is an alkyl group). It is further possible to use carboxylic acids represented by a formula RCOOH (R is an alkyl group), esters represented by a formula RCOOR' (R is an alkyl group), and ethers represented by a formula ROR' (R is an alkyl group).

In addition, it is possible to use hydrocarbons having a methyl group, e.g., methane, ethane, propane, and butane, and mix oxygen gas, CO gas, ammonia gas, and $CO_2$ gas.

The cleaning method of the third embodiment basically achieves the same functions and effects of the cleaning methods of the first and second embodiments. Especially in the cleaning method of the third embodiment, the gas supply unit supplies an etching gas into the vacuum vessel when performing cleaning by adjusting the electrodes in the same manner as in the first and second embodiments. Accordingly, the cleaning method of the third embodiment achieves the remarkable effect of etching away contaminants sticking to the electrode 7b (or 7a) of the ion beam generator 1b (or 1a) by an ion beam emitted form the opposite ion beam generator 1a (or 1b).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-266939, filed Oct. 16, 2008, and Japanese Patent Application No. 2009-230993, filed Oct. 2, 2009, which are hereby incorporated by reference herein in their entirety.

What is claimed is:

1. A method for cleaning a substrate processing apparatus in which a first ion beam generator and a second ion beam generator are arranged opposite to each other to sandwich a plane on which a substrate is to be placed, and which processes two surfaces of the substrate, the cleaning method comprising steps of:
    retreating the substrate from a position between the first ion beam generator and the second ion beam generator; and
    cleaning the second ion beam generator by emitting an ion beam from the first ion beam generator to the second ion beam generator.

2. The method according to claim 1, further comprising a step of removing electric charge held on an electrode of the second ion beam generator.

3. The method according to claim 1, wherein in the cleaning step, the ion beam emitted from the first ion beam generator is neutralized by emitting electrons to the second ion beam generator.

4. The method according to claim 1, wherein in the cleaning step, a potential is applied to an electrode as an object of cleaning among extracting electrodes of the second ion beam generator, thereby drawing the ion beam emitted from the first ion beam generator to the electrode as an object of cleaning.

5. The method according to claim 1, wherein in the cleaning step, an etching gas is supplied into a vacuum vessel for processing the substrate.

6. The method according to claim 1, further comprising the step of cleaning the first ion beam generator by emitting an ion beam from the second ion beam generator to the first ion beam generator.

7. An substrate processing apparatus for processing a substrate, comprising:
    a first ion beam generator and a second ion beam generator arranged opposite to each other to sandwich a plane on which the substrate is to be placed; and
    a controller which, with no substrate being placed on the plane, controls the first ion beam generator to clean the second ion beam generator by emitting an ion beam from the first ion beam generator to the second ion beam generator.

8. The apparatus according to claim 7, further comprising a neutralizer which emits electrons to the second ion beam generator,
    wherein the controller controls the neutralizer to prevent charging of the second ion beam generator by emitting electrons to the second ion beam generator.

9. The apparatus according to claim 7, wherein the controller controls a potential of an electrode as an object of cleaning among extracting electrodes of the second ion beam generator, such that the ion beam emitted from the first ion beam generator is drawn to the electrode as an object of cleaning.

10. The apparatus according to claim 7, wherein with no substrate being placed on the plane, the controller controls the second ion beam generator to clean the first ion beam generator by emitting an ion beam from the second ion beam generator to the first ion beam generator.

* * * * *